United States Patent [19]
Kato et al.

[11] Patent Number: 4,823,217
[45] Date of Patent: Apr. 18, 1989

[54] CIRCUITING DEVICE

[75] Inventors: Minoru Kato; Yutaka Hayashi, both of Chichibu, Japan

[73] Assignee: Canon Denshi Kabushiki Kaisha, Chichibu, Japan

[21] Appl. No.: 91,302

[22] Filed: Aug. 27, 1987

Related U.S. Application Data

[63] Continuation of Ser. No. 748,952, Jun. 26, 1985, abandoned.

[30] Foreign Application Priority Data

Jul. 5, 1984 [JP] Japan .................... 59-138012

[51] Int. Cl.$^4$ ............ G11B 5/48; H05K 1/00
[52] U.S. Cl. .................... 360/104; 439/494
[58] Field of Search ............ 439/67, 492–499; 360/97–99, 104–106

[56] References Cited

U.S. PATENT DOCUMENTS 4,188,714 2/1980 Jean .................... 339/17 F X
4,432,027 2/1984 Higuchi .................... 360/99 X Primary Examiner—A. J. Heinz
Attorney, Agent, or Firm—Spencer & Frank

[57] ABSTRACT

A circuiting device comprising a flexible base member having end portions to be fixed, a movable portion therebetween and conductor patterns carried on the base member. Parts of the portions to be fixed adjacent to the movable portion are covered by protective films which prevent solder from flowing to the movable portion from the portions to be fixed. This arrangement prevents disconnection and short circuit in the conductor patterns on the circuiting device, and facilitates connecting operations.

8 Claims, 3 Drawing Sheets

CIRCUITING DEVICE

This application is a continuation of application Ser. No. 748,952, filed Jun. 26, 1985, now abandoned.

BACKGROUND OF THE INVENTION

1. Field of the Invention

The present invention relates to a circuiting device, and more particularly to a circuiting device used to connect electrically a fixed member to a movable member, or a movable member to a movable member.

2. Description of the Prior Art

As an example of a circuiting device used to connect electrically a fixed member to a movable member, or a movable member to a movable member, known is a flexible printed circuit board which has electrical wiring disposed on a surface of a flexible insulating material. This flexible printed circuit board can be used in various electronics applications. In one example, such a flexible printed circuit board can be used to connect a magnetic head which performs recording and/or reproducing of information to and/or from a magnetic disc as a recording medium in a magnetic disc unit to external circuits. A supporting structure of a magnetic head in a floppy disc unit is disclosed, for example, in U.S. Pat. Nos. 4,151,573 and 4,379,316.

FIG. 1 shows an outline of an arrangement of a magnetic disc and a magnetic head in a floppy disc unit.

In FIG. 1, reference numerals 3 and 5 denote magnetic heads. The magnetic head 3 disposed on the lower surface of a magnetic disc 1 is supported by an elastic plate 6 provided at an end of a carriage 2. The magnetic head 5 disposed on an upper surface of a magnetic disc 1 is supported elastically on the lower surface of an end of an arm 4. These two heads 3 and 5 sandwich a circular magnetic disc 1. The rotation of the magnetic disc 1 in the direction shown by arrow A causes magnetic gaps in magnetic cores not shown in detail on magnetic heads 3 and 5 to slide on the magnetic disc 1, thereby performing recording and/or reproducing to and/or from the upper and lower surfaces of said magnetic disc 1.

A detailed explanation of an arrangement for connecting such magnetic heads to a conventional flexible printed circuit board will be made with reference to FIGS. 2A–2C.

FIG. 2A is a plan view, FIG. 2B a side view and FIG. 2C a bottom view. These drawings show the arrangement on the side of the magnetic head 3, and the arrangement on the side of the magnetic head 5 is approximately the same as the former arrangement except that it has an upside-down relation with respect thereto.

In these drawings, reference numeral 6 denotes an elastic plate supporting the magnetic head 3. This plate 6 is made of a material such as copper alloy or stainless steel, and in this case the plate 6 is formed into an approximately square shape with both ends or surrounding portions fixed by adhesion to the above-mentioned carriage 2. Furthermore, the magnetic head 3 is assembled on both the upper and lower surfaces of an attachment portion 6A formed in the central portion of the elastic plate 6.

The attachment portion 6A is formed into an approximately square shape by four L-shaped long holes 6B, and is bridged to the circumferential portions of the elastic plate 6 at the respective centers of its four sides by bridge portions 6C between the long holes 6B.

Accordingly, the magnetic head 3 is supported swingably over a specified range around X and Y axes shown in FIG. 2A due to the elasticity of the above-mentioned bridge portions 6C, and movably over a specified range upward and downward in FIG. 2B due to the entire elasticity of the elastic plate 6.

The magnetic head 3 comprises the following members.

Reference numerals 7A and 7B denote front core halves (hereinafter referred to as core halves) in the form of a thin plate. These core halves 7A and 7B are opposed to each other via a magnetic gap $G_1$ and implanted on both surfaces of the elastic plate 6 with the magnetic gap $G_1$ on the upper side in a manner that the core halves are inserted through the plate 6 upward and downward. A back core 8 is coupled to the side surface of the lower side portion to complete the arrangement of the magnetic core for recording and/or reproducing. The portion of the core halves 7A and 7B protruding from the elastic plate 6 are sandwiched by mask blocks 10 and 11 which function as a reinforcement member and a slider through spacers 9 and 9, respectively. Furthermore, a coil 12 is wound around a portion of the core half 7A between the elastic plate 6 and the back core 8.

Reference numerals 13A and 13B denote thin-plate core halves like the core halves 7A and 7B, and two sets of the core halves are provided. The core halves 13A and 13B in each of these two sets are opposed to each other via magnetic gaps $G_2$ and $G_2$, respectively. The core halves 13A and 13B of these two opposed sets sandwich a spacer 14 which is in line with the core halves 7A and 7B and implanted on both surfaces of the elastic plate 6 adjacent to the core halves 7A and 7B in a manner that the core halves are inserted through the plate 6 upward and downward. A back core 15 is coupled to the lower side of these two core halves 13A and 13B to complete the arrangement of a magnetic core for erasing. The portions of the two sets of cores halves 13A and 13B on the elastic plate 6 are sandwiched by the mask blocks 10 and 11, like the core halves 7A and 7B. Furthermore, a coil 16 is wound around the portion of the core half 13A between the elastic plate 6 and the back core 15.

Reference numeral 17 denotes a flexible printed circuit board as mentioned above, mostly in the form of film carrier tape which carries conductor patterns. This flexible printed circuit board 17 is formed from a material having flexibility, pliability and electrically insulating properties, and is shaped into a substantially I-shape, of which the width of fixed portions 17A and 17C at both ends is greater than the width of an intermediate movable portion 17B. One fixed portion 17A is fixed by a means such as adhesion to the attachment portion 6A of the elastic plate 6 which supports the magnetic head 3, and the other fixed portion 17C is fixed to the carriage 2. The movable portion 17B between the fixed portions 17A and 17C is not attached to the surface of the carriage 2, so that the movable portion 17B can bend and twist freely.

In this manner, the movable portion 17B is movable, and the entire flexible printed circuit board 17 has flexibility and pliability, so that the flexible printed circuit board 17 follows the movement of the attachment portion 6A of the elastic plate 6 without restricting that movement, i.e., without restricting the movement of the magnetic head 3, if the length of the flexible printed circuit board 17 is suitably determined.

As shown in FIG. 2C, a plurality of narrow stripes of conductor patterns 18 are formed by copper foil on the lower surface of the flexible printed circuit board 17. The conductor patterns 18 extend from the fixed portion 17A to the fixed portion 17C, and are formed in a substantially parallel fashion so that they do not contact each other. At an end of the conductor patterns 18 on the fixed portion 17A is formed circular connection portions 18A, and at the other end of the conductor patterns 18 on the fixed portion 17C is formed oblong connecting portions 18B.

The connecting portions 18A are connected respectively to terminals 12A and 16A of the above-mentioned coils 12 and 16 by a conductive connecting material, such as solder. Similarly, the connection portions 18B are connected by a means such as soldering respectively to lead wires 19 that are connected to external circuits. This arrangement connects the magnetic head 3 to the external circuits through the conducting patterns 18.

When performing recording and/or reproducing on a magnetic disc using the arrangement of a magnetic head as described above, the magnetic heads 3 and 5 that are supported movably as described above follow in their movement the oscillation generated in the magnetic disc 1 by its rotation, so that damage to the surface of the magnetic disc 1 is prevented, and recording and/or reproducing is performed smoothly.

If the above-mentioned magnetic heads 3 and 5 swing or move upward and downward, following the oscillation of the magnetic disc 1, the flexible printed circuit board 17 also moves to follow this movement, and the forces acting on the flexible printed circuit board 17 at this time are particularly large at the respective boundaries C and D between the fixed portions 17A and 17C and the movable portion 17B, as shown by dotted lines in FIG. 2C. As a result, there is the possibility that the conducting patterns 18 will become disconnected at these portions.

This disconnection occurs when the connecting portions 18A and 18B are connected to the terminals 12A and 16A of the coils 12 and 16 and to the lead wires 19 of the external circuits. That is, if a connecting material such as solder flows from the connecting portions 18A and 18B over the boundaries C and D into the region of the movable portion 17B, the areas around the boundaries C and D on the conducting patterns 18 lose flexibility due to the adhesion of the connecting material to the patterns 18, so that cracks are likely to occur in the said areas and consequently the conducting patterns 18 are likely to be disconnected.

The flow of the connecting material sometimes causes short-circuits between the conducting patterns. Furthermore, peeling of the conducting patterns 18 can occur easily depending in particular on the manner of soldering.

Consequently, special care must be taken when connecting the connecting portions 18A and 18B to the terminals 12A and 16A and to the leads 19 in order to avoid the above-mentioned overflow of the connecting material and peeling of the conducting patterns, and therefore such connecting works are troublesome and time-consuming.

In order to prevent overflow of a connecting material such as solder, consideration has been given to covering all of the above-mentioned flexible printed circuit board 17 except the connecting portions 18A and 18B of the conducting patterns 18, with polyimide resin or resist. This method, however, damages the flexibility and pliability of the flexible printed circuit board 17, so that the movement of the magnetic head 3 is limited. Therefore, this method cannot be used.

The above problems are not limited to the above-mentioned flexible printed circuit board used in magnetic disc units but are common to all circuiting devices mentioned above, that is, circuiting devices which are used to connect electrically a fixed member to a movable member, or a movable member to a movable member portion.

SUMMARY OF THE INVENTION

It is, therefore, an object of the present invention to provide a circuiting device having excellent reliability in its connecting portion and excellent flexibility and pliability, and which facilitates the making of simple connections.

It is another object of the present invention to provide a magnetic head supporting assembly using a circuiting device having excellent reliability in its connecting portion and excellent flexibility and pliability, and which facilitates the making of simple connections.

In order to achieve these objects, in a first aspect of the present invention, a circuiting device for connecting electrically electrical circuits comprises:

a flexible base member having at least one first portion and a second portion adjacent to the first portion;

an electrical wiring portion disposed on at least one surface of the base member in a manner such that the electrical wiring portion is formed on both the first portion and the second portion;

at least one connecting portion provided on the first portion as an integral portion of the electrical wiring portion for connecting the electrical wiring portion to at least one external circuit by a connecting material; and at least one protective film formed on surface areas of the base member between the connecting portion and the second portion so that the connecting material is prevented from flowing from the connecting portion to the second portion.

Here, the first portion may be a portion to be fixed to a member other than the circuiting device and the second portion can be a movable portion. The base member may be a flexible printed circuit board. The protective film may be made of resist, adhesive or plastic film.

In a second aspect of the present invention, a circuiting device comprises:

a flexible base member having electrical insulating properties;

an electrical wiring portion disposed on at least one surface of the base member;

at least one connecting portion disposed on at least one end of the electrical wiring portion and for connecting electrically the electrical wiring portion to external circuits; and at least one insulating protective film disposed so as to cover only a portion of the electrical wiring portion having a specified width in the direction from the connecting portion to the electrical wiring portion, adjacent to an area needed for electrical connection with the external circuits.

Here, the area may have an area required to hold a connecting material when the electrical wiring portion is connected electrically to the external circuits by the connecting material. The flexible base member may have an elongated plate and may have at least one end fixed mechanically to the external circuits, and the insulating protective film can be disposed on a portion of the fixed end other than the area. The insulating protective film can be disposed in a direction intersecting the longitudinal direction of the base member. The flexible base member may be a flexible printed circuit board and the electrical wiring portion may be printed wiring on the flexible printed circuit board. The insulating protective film may be made of resist, adhesive or plastic film.

Furthermore, a third aspect of the present invention provides a magnetic head supporting assembly which comprises:

a magnetic head;

a member for supporting the magnetic head;

a circuiting device connecting the magnetic head to external circuits, the circuiting device including:

a flexible base member having at least one portion to be fixed and a movable portion adjacent to the portion to be fixed;

an electrical wiring portion disposed on at least one surface of the base member in a manner such that the electrical wiring portion is formed on both of the portion to be fixed and the movable portion;

at least one connecting portion provided on the portion to be fixed as an integral portion of the electrical wiring portion for connecting the electrical wiring portion to at least one external circuit by a connecting material; and at least one protective film formed on surface areas of the base member between the connecting portion and the movable portion so that the connecting material is prevented from flowing from the connecting portion to the movable portion.

The above and other objects, effects, features and advantages of the present invention will become more apparent from the following description of preferred embodiments thereof taken in conjuction with the accompanying drawings.

DETAILED DESCRIPTION OF PREFERRED EMBODIMENTS

An embodiment of a circuiting device according to the present invention will be explained for the case in which the circuiting device is applied to a flexible printed circuit board which connects a magnetic head to external circuits.

It should be noted that the present invention is not limited to the following embodiment and can be widely applied to electrically connect a movable member to a fixed or movable member, such as the printing head of a printer.

Figure 1:
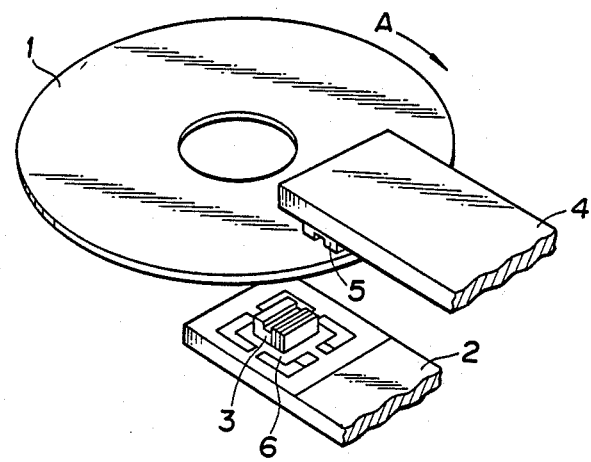
FIG. 1 is a schematic view showing an arrangement of a magnetic disc and a magnetic head in a magnetic disc unit.
Figure 3:
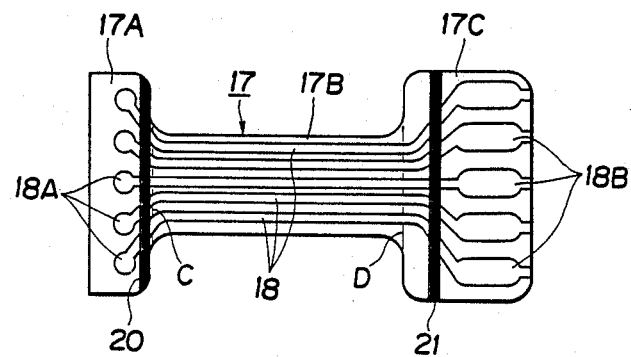
FIG. 3 is a plan view showing an arrangement of a flexible printed circuit board as an embodiment of the present invention.
Figure 2A:
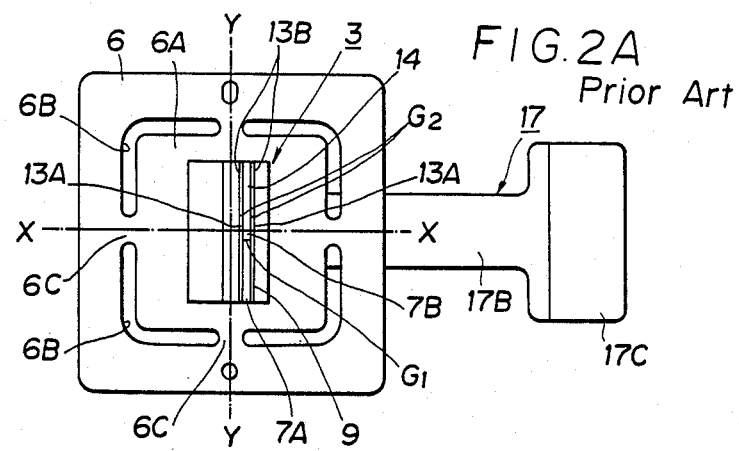
FIG. 2A is a top view showing an arrangement in which a conventional flexible printed circuit board is connected to a magnetic head.
Figure 2B:
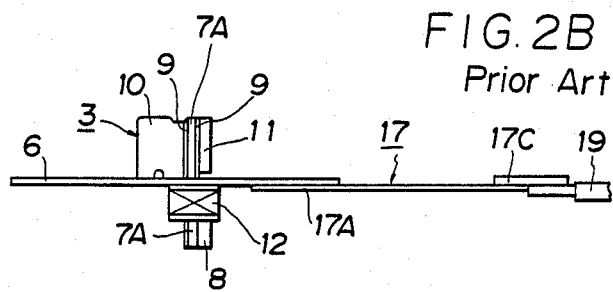
FIG. 2B is a side view showing the arrangement shown in FIG. 2A.
Figure 2C:
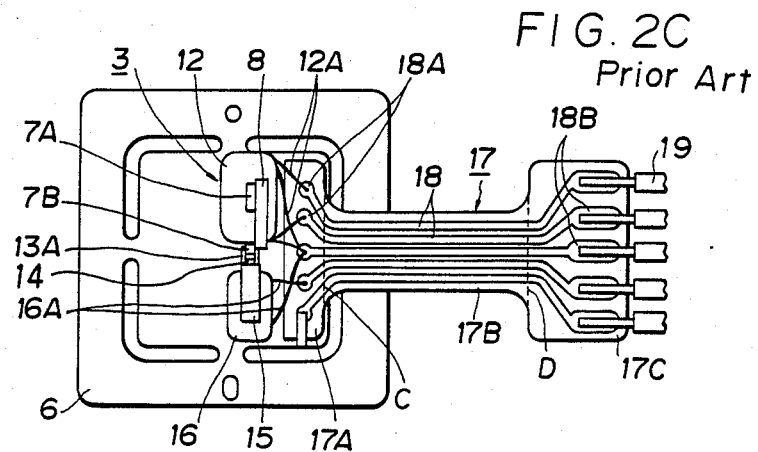
FIG. 2C is a bottom view showing the arrangement shown in FIG. 2A.

FIG. 3 is a bottom view showing an embodiment of a flexible printed circuit board according to the present embodiment.

As shown in FIG. 3, the flexible printed circuit board 17 in the present embodiment has approximately the same arrangement as in the conventional example described above, except two stripes of protective film 20 and 21 are formed additionally on the surface of the flexible printed circuit board 17 having the conductor patterns 18. These protective films 20 and 21 prevent a connecting material such as solder from flowing from the connection portions 18A and 18B to the conductor patterns 18. The stripes 20 and 21 have a very small width in the longitudinal direction of the pattern 18 relative to the overall length of the flexible printed circuit board 17.

The protective film 20 is formed adjacent to and extremely close to the connecting portions 18A along the boundary C between the above-mentioned fixed portion 17A and the movable portion 17B substantially linearly from the top edge to the bottom edge of the fixed portion 17A traversing all the conductor patterns 18 substantially perpendicularly.

The other protective film 21 is formed adjacent to and extremely close to the connecting portion 18B along the boundary D between the fixed portion 17C and the movable portion 17B substantially linearly from the top edge to the bottom edge of the fixed portion 17C traversing all the conductor patterns 18 substantially perpendicularly.

The protective films 20 and 21 are formed by coating resist or adhesive, or by the adhesion of a plastic film such as polyimide film.

The above arrangement of the flexible printed circuit board 17 prevents a connecting material such as solder from flowing from the connecting portions 18A and 18B to the movable portion 17B.

Consequently, the above-mentioned disconnection and short circuit in the conductor patterns 18 due to the overflow and adhesion of the connecting material are prevented by the protective films 20 and 21. As a result, the connecting operations are facilitated.

Furthermore, because the protective films 20 and 21 are mounted within the area of the fixed portions 17A and 17C, and not within the area of the movable portion 17B, the flexibility and pliability of the movable portion 17B, that is the flexibility and pliability of the flexible printed circuit board 17 are not lost.

The shape of the protective films 20 and 21 is not limited to a straight line as described above. They can be of any shape that prevents the overflow of connecting material. Furthermore, the protective films 20 and 21 can be disposed at any position within the area of the fixed portions 17A and 17C where the films 20 and 21 prevent the overflow of connecting material into the movable portion 17B.

Figure 4A:
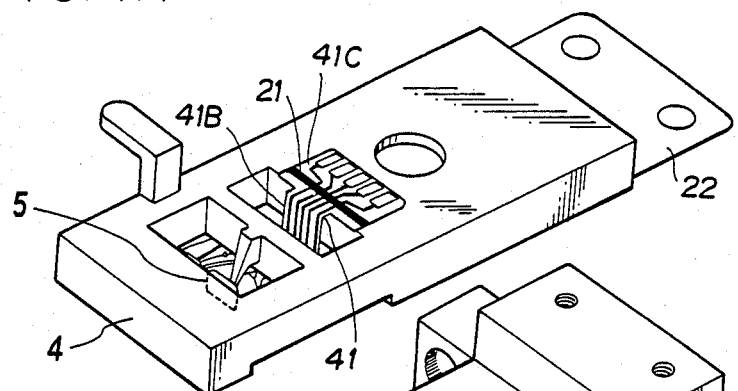
FIG. 4A is a perspective view showing details of an arm of a magnetic head supporting arrangement in which a circuiting device according to the present invention is used.
Figure 4B:
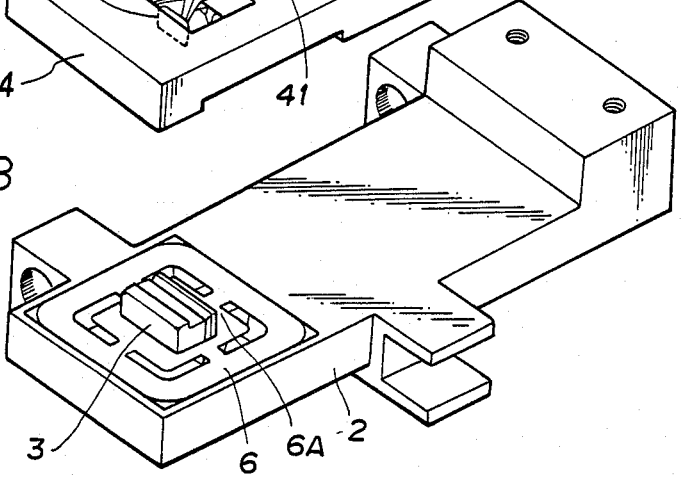
FIG. 4B is a perspective view showing details of a carriage of the arm shown in FIG. 4A.
Figure 4C:
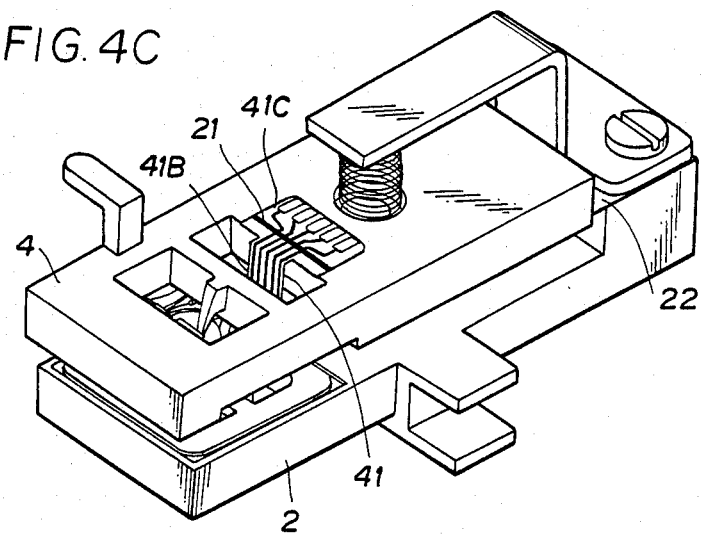
FIG. 4C is a perspective view showing an assembly of the arm shown in FIG. 4A and the carriage shown in FIG. 4B.

FIGS. 4A–4C show an embodiment of a circuiting device according to the present invention as applied to a magnetic head supporting arrangement.

FIG. 4A is a perspective view showing an arm 4 for supporting an upper magnetic head 5. FIG. 4B is a perspective view showing a carriage 2 supporting a magnetic head 3. FIG. 4C shows an assembly of the arm 4 and the carriage 2.

The arm 4 is coupled swingably to the carriage 2 through a leaf spring 22. Reference numeral 41 denotes a circuiting device for connecting the magnetic head 5 electrically to external circuits. The circuiting device 41 has conducting patterns formed on the surface of a flexible insulating base member in the form of film carrier tape. A protective film 21 is disposed on a fixing portion 41C of the circuiting device 41, and a protective film 20 is disposed adjacent to the connecting portion on the side of the magnetic head 5 side. The portion denoted by reference numeral 41B can move freely following the movement of the magnetic head 5. The circuiting device connecting the magnetic head 3 to the external circuits is disposed under the lower surface of the carriage 2. One of its ends i.e., portions to be fixed is fixed to the carriage 2 and the other end is fixed to an attaching portion 6A of the elastic plate 6. The central movable portion of the circuiting device is not fixed to the carriage 2 and can move freely following the movement of the magnetic head 3. The protective films 20 and 21 are disposed in the vicinity of the electrical connecting portions in both fixed end portions of the circuiting device. The magnetic head supported by the supporting arrangement moves without being limited by the circuiting device, so that the magnetic head moves freely to follow the movement of the magnetic disc.

The circuiting device according to the present invention which has the protective films as described above is suitable for electrical connection of a magnetic head in which both heads are supported by a gimbal spring, as shown in FIG. 4A to FIG. 4C. Furthermore, a circuiting device in accordance with the present invention is not limited to the above-mentioned flexible printed circuit board 17, but can be applied to various circuiting devices mentioned above that are used to connect electrically a movable member to a fixed member or a movable member, while maintaining the same above-mentioned effects.

As clear from the above explanation, in the present invention, the protective film for preventing the flow of a connecting material from a connecting portion to a movable portion is formed within an area excluding the movable portion, so that disconnection and short circuits can be prevented. The connecting operations are extremely easy to carry out. The present invention provides an excellent circuiting device which does not lose its flexibility and pliability. If the circuiting device according to the present invention is used to connect a magnetic head in a magnetic disc unit to external circuits, the reliability of the magnetic head is improved. The same improvement is realized in various applications such as a printer head.

We claim:

1. A circuiting device comprising:
   a flexible base member including at least one end portion having a first width, a second portion adjacent said at least one end portion having a second width, and electrical insulating properties, said first width being greater than said second width;
   an electrical wiring portion disposed on at least one surface of said base member;
   at least one connecting portion disposed on said at least one end portion having said first width and on at least one end of said electrical wiring portion for connecting electrically said electrical wiring portion to an external circuit, said electrical wiring portion being movable relative to said at least one connecting portion; and
   at least one insulating protective film disposed on said at least one end portion having said first width and in a direction intersecting said electrical wiring portion, said at least one insulating protective film having the shape of a stripe and covering only a portion of said electrical wiring portion having a specified width in the direction from said connecting portion to said electrical wiring portion, said at least one insulating protective film being adjacent to an area for making an electrical connection with said external circuit, whereby a connecting material comprising said connecting portion is prevented from flowing from said connecting portion to said second portion.

2. A circuiting device as claimed in claim 1, wherein said area has an area required to hold a connecting material when said electrical wiring portion is connected electrically to said external circuit by said connecting material.

3. A circuiting device as claimed in claim 1, wherein said flexible base member has an elongated plate and has at least one end fixed mechanically to said external circuit, and said insulating protective film is disposed on a portion of the fixed end other than said area.

4. A circuiting device as claimed in claim 1, wherein said flexible base member is a flexible printed circuit board and said electrical wiring portion is printed wiring on said flexible printed circuit board.

5. A circuiting device as claimed in claim 1, wherein said insulating protective film is made of resist, adhesive or plastic film.

6. A circuiting device as claimed in claim 1, wherein said connecting portions are disposed at both ends of said flexible base member and said pair of connecting portions are electrically connected by said electrical wiring portion, said pair of connecting portions being movable with respect to each other.

7. A magnetic head supporting assembly comprising:
   a magnetic head;
   a member for supporting said magnetic head; and
   a circuiting device connecting said magnetic head to external circuits, said circuiting device including a flexible base member having at least one portion to be fixed and a movable portion adjacent to and movable relative to said at least one portion to be fixed, said at least one portion having a first width and said movable portion having a second width, said first width being greater than said second width;
   an electrical wiring portion disposed on at least one surface of said base member, said electrical wiring portion having an end and being formed on both said portion to be fixed and said movable portion;
   at least one connecting portion provided on said at least one portion to be fixed and at said end of said electrical wiring portion as an integral portion of said electrical wiring portion to at least one external circuit by a connecting material, said at least one connecting portion and said electrical wiring portion being disposed on said flexible member; and
   at least one protective film formed on surface areas of said base member in the vicinity of said at least one connecting portion and between said at least one connecting portion and said movable portion in a direction intersecting said electrical wiring portion, said at least one protective film having the shape of a stripe and covering only a portion of said electrical wiring portion so that said connecting material is prevented from flowing from said connecting portion to said movable portion.

8. A circuiting device as claimed in claim 7, wherein said connecting portions are disposed at both ends of said flexible base member and said pair of connecting portions are electrically connected by said electrical wiring portion, said pair of connecting portions being movable with respect to each other.

* * * * *